United States Patent [19]

Ogawa et al.

[11] Patent Number: 4,483,911
[45] Date of Patent: Nov. 20, 1984

[54] PHOTOCONDUCTIVE MEMBER WITH AMORPHOUS SILICON-CARBON SURFACE LAYER

[75] Inventors: Kyosuke Ogawa, Sakurashin; Shigeru Shirai, Yamato; Junichiro Kanbe, Yokohama; Keishi Saitoh, Tokyo; Yoichi Osato, Yokohama, all of Japan

[73] Assignee: Canon Kabushiki Kaisha, Tokyo, Japan

[21] Appl. No.: 450,772

[22] Filed: Dec. 17, 1982

[30] Foreign Application Priority Data

Dec. 28, 1981 [JP] Japan .................. 56-213384
Dec. 28, 1981 [JP] Japan .................. 56-213385
Dec. 28, 1981 [JP] Japan .................. 56-213386

[51] Int. Cl.$^3$ ............................... G03G 5/082
[52] U.S. Cl. ........................ 430/65; 430/84; 430/95
[58] Field of Search ............. 430/60, 63, 65, 66, 430/67, 84, 128

[56] References Cited

U.S. PATENT DOCUMENTS

| | | | |
|---|---|---|---|
| 3,210,184 | 10/1965 | Uhlig | 430/65 |
| 4,217,374 | 8/1980 | Ovshinsky et al. | 430/84 X |
| 4,226,898 | 10/1980 | Ovshinsky et al. | 430/84 X |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |
| 4,361,638 | 11/1982 | Higashi et al. | 430/84 |
| 4,378,417 | 3/1983 | Maruyama et al. | 430/57 |
| 4,394,425 | 7/1983 | Shimizu et al. | 430/65 |

*Primary Examiner*—John E. Kittle
*Assistant Examiner*—John L. Goodrow
*Attorney, Agent, or Firm*—Fitzpatrick, Cella, Harper & Scinto

[57] ABSTRACT

A photoconductive member comprises a support and an amorphous layer comprising a first layer region and a second layer region, the first layer region having photoconductivity comprising an amorphous material which comprises silicon atoms as a matrix and at least one member selected from hydrogen atoms and halogen atoms as a constituent, the first layer region having a layer region (I) containing an impurity controlling the electroconductivity type at the support side, and the second layer region comprising an amorphous material comprising at least both silicon and carbon as constituents.

18 Claims, 2 Drawing Figures

PHOTOCONDUCTIVE MEMBER WITH AMORPHOUS SILICON-CARBON SURFACE LAYER

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays and gamma-rays and the like).

2. Description of the Prior Art

Photoconductive materials constituting photoconductive layers for solid state image pick-up devices, electrophotographic image forming members in the field of image formation, or manuscript reading devices are required to have a high sensitivity, a high SN ratio [Photocurrent (Ip)/Dark Current (Id)], absorption spectral characteristics matching to the spectral characteristics of irradiating electromagnetic waves, a good response to light, a desired dark resistance value as well as no harm to human bodies during usage. Further, in a solid state image pick-up device, it is also required that the residual image should be easily treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as "a-Si") has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 discloses application of a-Si for use in a photoelectric converting reading device.

However, under the present circumstances, although the photoconductive members having photoconductive layers constituted of a-Si of the prior art have been attempted to be improved with respect to individual characteristics, including various electrical, optical and photoconductive characteristics such as dark resistance value, photosensitivity and response to light, repeating characteristics, environmental characteristics in use, and further stability with lapse of time and durability, there exists room for further improvement in overall characteristics.

For instance, when the a-Si photoconductor is applied to an image forming member for an electrophotographic device, residual potential is frequently observed to remain during use thereof if increases in both photosensitivity and dark resistance are contemplated.

When such a photoconductive member is repeatedly used for a long time, there will be caused various problems such as accumulation of fatigue by repeated uses or the so-called ghost phenomenon wherein residual images are formed.

Further, a-Si materials may contain as constituent atoms hydrogen atoms or halogen atoms such as fluorine atoms, chlorine atoms, etc. for improving their electrical, photoconductive characteristics, and boron atoms, phosphorus atoms, etc. for controlling the electroconductivity type, and further other atoms for improving other characteristics. Depending on the manner in which these constituent atoms are contained, there may sometimes be caused problems with respect to electrical, optical or photoconductive characteristics, environmental characteristics in use, or dielectric strength of the layer formed.

For example, there are problems as shown below. The life of photocarriers produced in the formed photoconductive layer by irradiation is not long enough in the layer. Images transferred to a receiving paper often suffer from defective images, so-called "blank areas", caused by a local discharge breakdown. When a blade is used for cleaning, other defective images, so-called "white lines", are produced which seem to be produced due to rubbing with the blade. Further, when the photoconductive layer is used in a highly humid atmosphere or is used directly after standing it in a highly humid atmosphere for a long time, there are often produced disadvantageously so-called "unfocused images".

Thus, it is required in designing a photoconductive material to make efforts to overcome all of such problems as mentioned above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography, solid state pick-up devices and reading devices etc. It has now been found that a photoconductive member having a photoconductive layer comprising a-Si, in particular, an amorphous material constituted of at least one of hydrogen atom (H) and halogen atom (X) in a matrix of silicon [hereinafter referred to comprehensively as a-Si (H, X)], (for example, so-called hydrogenated amorphous silicon, halogenated amorphous silicon or halogen-containing hydrogenated amorphous silicon), exhibits not only practical, extremely good characteristics, but also surpasses conventional photoconductive members in substantially all aspects, provided that the photoconductive member is made to have a specific layer structure as explained in the following. The photoconductive member has markedly excellent characteristics for electrophotography.

The present invention is based on the above mentioned discovery.

SUMMARY OF THE INVENTION

An object of the present invention is to provide a photoconductive member having substantially constant stable electrical, optical and photoconductive characteristics, suffering from substantially no influence from its use environment, and being especially excellent in light fatigue resistance, excellent in durability and humidity resistance without causing any deterioration phenomenon after repeated uses and entirely or substantially free from residual potentials.

Another object of the present invention is to provide a photoconductive member, which is sufficiently capable of bearing charges at the time of charging treatment for formation of electrostatic charges to an extent that a conventional electrophotographic method can be very effectively applied when it is provided for use as an image forming member for electrophotography.

Still another object of the present invention is to provide a photoconductive member for electrophotography capable of providing easily a high quality image which is free from defective images and unfocused images and is high in density, clear in half-tone and high in resolution even when used for a long time.

A further object of the present invention is to provide a photoconductive member having high photosensitivity, high SN ratio characteristic and high dielectric strength.

According to the present invention, there is provided a photoconductive member which comprises a support for a photoconductive member and an amorphous layer comprising a first layer region overlying the support and a second layer region overlying the first layer region, the first layer region having photoconductivity comprising an amorphous material which comprises silicon atoms as a matrix and at least one member selected from the group consisting of hydrogen atoms and halogen atoms as a constituent, the first layer region having a layer region (I) containing an impurity capable of controlling the electroconductivity type at the support side, and the second layer region comprising an amorphous material selected from the group consisting of an amorphous material (1) composed of silicon and carbon atoms of the formula: $Si_aC_{1-a}$ ($0<a<1$), an amorphous material (2) composed of silicon, carbon and hydrogen atoms of the formula: $(Si_bC_{1-b})_cH_{1-c}$ ($0<b, c<1$) and an amorphous material (3) composed of silicon, carbon and halogen (X) atoms, and if desired, additionally hydrogen atom of the formula: $(Si_dC_{1-d})_e(X, H)_{1-e}$ ($0<d, e<1$).

DETAILED DESCRIPTION OF THE PREFERRED EMBODIMENTS

Figure 1:
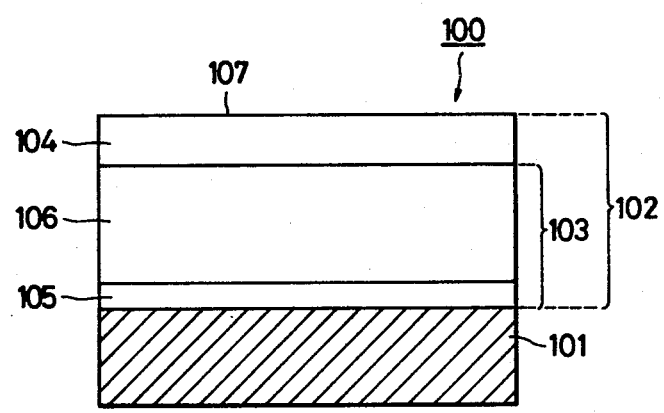
FIG. 1 shows a schematic sectional views for illustration of the layer constitution of a preferred embodiment of the photoconductive member according to the present invention.

The photoconductive members of the present invention will be explained referring to the drawing below.

FIG. 1 schematically shows a layer constitution of the photoconductive member according to the present invention.

Referring to FIG. 1, a photoconductive member 100 is constituted of a support 101 for photoconductive members and an amorphous layer 102 overlying the support 101.

The amorphous layer 102 is constituted of a first layer region 103 composed of a-Si(H, X) and having photoconductivity, and a second layer region 104 comprising an amorphous material comprising at least both silicon and carbon as constituents.

The first layer region 103 has a layer region (I) 105 containing an impurity controlling the electroconductivity type at the support 101 side.

The support 101 used for the photoconductive member 100 in the present invention may be either electroconductive or insulating. As the electroconductive support, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports may suitably have at least one surface subjected to an electroconductivizing treatment, and it is desirable to provide other layers on the side to which said electroconductivizing treatment has been applied.

For example, electroconductivizing treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) etc. thereon. Alternatively, a synthetic resin film such as polyester film can be subjected to the electroconductivizing treatment on its surface by vacuum vapor deposition, electron-beam deposition or sputtering of a metal such as NiCr, Al, Ag, Pd, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness which is conveniently determined so that a photoconductive member as desired may be formed. When the photoconductive member is required to have a flexibility, the support is made as thin as possible, so far as the function of a support can be sufficiently exhibited. However, in such a case, the thickness is generally about 10µ from the points of fabrication and handling of the support as well as its mechanical strength.

The first layer region 103 constituting a part of amorphous layer 102 formed or support 101 has a layer region (I) 105 containing an impurity controlling the electroconductivity type in the end layer region at the support 101 side.

Layer region (I) 105 may contain a p-type impurity, an atom of Group III of the Periodic Table, for example, preferably B, Al, Ga, In, Tl and the like.

Layer region (I) 105 may contain an n-type impurity, an atom of Group V of the Periodic Table, for example, preferably N, P, As, Sb, Bi and the like.

In particular, as the impurity, there are preferably employed B, Ga, P, Sb and the like.

The impurity contained in layer region (I) 105 is distributed such that the impurity is substantially uniformly distributed in the direction of layer thickness of layer region (I) 105 and in a plane parallel to the interface between the support 101 and layer region (I) 105.

The amount of the impurity doping the layer region (I) 105 to impart a desired electroconductivity type thereto may be optionally determined depending upon the desired electrical and mechanical characteristics in connection with the layer thickness. In the case of impurity of Group III, the doping amount is usually $1.0-3\times10^4$ atomic ppm, preferably $5.0-1\times10^4$ atomic ppm, more preferably $1\times10-5\times10^3$ atomic ppm. In the case of impurity of Group V, the doping amount is usually $0.1-5\times10^3$ atomic ppm, preferably $0.5-1\times10^3$ atomic ppm, more preferably 1.0–800 atomic ppm.

In the present invention, formation of a first layer region 103 constituted of a-Si(H, X) may be conducted according to the vacuum deposition method utilizing discharging phenomenon, such as glow discharge method, sputtering method or ion-plating method. For example, for formation of the first layer region 103 constituted of a-Si(H, X) according to the glow discharge method, the basic procedure comprises introducing a starting gas for introduction of hydrogen atoms (H) and/or halogen atoms (X) together with a starting gas for supplying silicon atoms (Si) into the deposition chamber which can be internally brought to reduced pressure, wherein glow discharge is generated thereby to form a layer of a-Si(H, X) on the surface of a support placed at a predetermined position in the chamber. When it is to be formed according to the sputtering method, a starting gas for introduction of hydrogen atoms (H) and/or halogen atoms (X) may be introduced into the chamber for sputtering when effecting sputtering using the target formed of silicon (Si) in an atmosphere of an inert gas such as Ar, He or a gas mixture based on these gases.

The starting gas for supplying Si to be used in the present invention may include gaseous or gasifiable silicon hydrides (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atoms to be used in the present invention, there may be mentioned a number of halogen compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as fluorine, chlorine, bromine or iodine and interhalogen compounds such as $BrF$, $ClF$, $ClF_3$, $BrF_5$, $BrF_3$, $IF_3$, $IF_7$, $ICl$, $IBr$, and the like.

As the silicon compound containing halogen atom, that is, a silane derivative substituted by a halogen atom, silicon halides such as $SiF_4$, $Si_2F_6$, $SiCl_4$, $SiBr_4$, or the like are preferred.

When the specific photoconductive member of this invention is formed according to the glow discharge method by use of such a silicon compound containing halogen atom, it is possible to form a photoconductive layer constituted of a-Si containing halogen atoms as a constituent on a given support without use of a silicon hydride gas as the starting gas capable of supplying Si.

In forming the amorphous layer containing halogen atom according to the glow discharge method, the basic procedure comprises feeding a starting gas for supplying Si, namely a gas of silicon halide and a gas such as Ar, $H_2$, He, etc. at a predetermined component ratio and a gas flow rate into the deposition chamber for formation of the first layer region, followed by excitation of glow discharge to form a plasma atmosphere of these gases, thereby forming the first layer region on a support 101. It is also possible to form a layer by mixing a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of an amorphous layer of a-Si(H, X) by the reactive sputtering method or the ion-plating method, for example, a target of Si is used and sputtering is effected in a suitable gas plasma atmosphere in case of the sputtering method. Alternatively, in case of ion-plating method, a polycrystalline or single crystalline silicon is placed as a vaporization source in a vaporization boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for introduction of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are to be introduced, a starting gas for introduction of hydrogen atoms such as $H_2$ and a gas such as silanes as mentioned above may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halo-substituted silicon hydride, including $SiH_2F_2$, $SiH_2I_2$, $SiH_2Cl_2$, $SiHCl_3$, $SiH_2Br_2$, $SiHBr_3$ and the like as an effective starting material for formation of the first layer region.

These halides containing hydrogen atom can introduce hydrogen atoms which is very effective for controlling electrical or optical characteristics into the layer during formation of the amorphous layer simultaneously with introduction of halogen atoms. Therefore, these halides containing hydrogen atom can be preferably used as the starting material for introduction of halogen atoms.

For incorporation of hydrogen atoms, in addition to halogen atoms, structurally into the layer, alternatively, $H_2$ or a gas of silicon hydride, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reactive sputtering method, a Si target is used and a gas for introduction of halogen atoms and $H_2$ gas are introduced together with, if necessary, an inert gas such as He, Ar, etc. into a deposition chamber, wherein a plasma atmosphere is formed to effect sputtering with said Si target, thereby forming a layer of a-Si(H, X) on the substrate.

Further there may also be introduced a gas such as of $B_2H_6$ or others in order to effect also doping of impurities.

The amount of hydrogen atoms (H) or halogen atoms (X) incorporated in the first layer region of a photoconductive member or total amount of both of these atoms when hydrogen atoms and halogen atoms are contained, may be preferably 1 to 40 atomic %, preferably 5 to 30 atomic %.

For controlling the amounts of hydrogen atoms (H) and/or halogen atoms (X) in the layer, the support temperature and/or the amounts of the starting materials for incorporation of hydrogen atoms (H) or halogen atoms (X) to be introduced into the deposition device system, or the discharging power may be controlled.

Upon producing the first layer region 103 of the present invention by a glow discharge method or a sputtering method, a rare gas such as He, Ne, Ar and the like may be preferably used as a diluting gas.

Upon producing layer region 103, the layer region (I) 105 may be formed at the support 101 side by doping with an impurity. For example, upon producing the layer region, a starting material for introducing the impurity in a gaseous form is introduced into the deposition chamber together with the main starting material for producing the first layer region 103.

As the starting materials for introducing the impurities, there are preferably used such materials which are in a gas form at ambient temperature and atmospheric pressure or can be easily gasified under the layer forming conditions.

Representative starting materials for introducing the impurities are $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $B_6H_{14}$, $AlCl_3$, $GaCl_3$, $InCl_3$, $TlCl_3$ and the like.

A layer region (n) 106 constituting a part of the first layer region 103 and overlying the layer region (I) 105 is provided so as to impart mainly the flowing characteristics to the photoconductive member. That is, a desired acceptance potential characteristics can be obtained; photocarriers can be generated effectively by light irradiation and the photocarrier thus generated can be effectively transported to a predetermined direction.

Layer region (n) 106 is formed as a layer region which does not contain the impurity as contained in layer region (I) 105, from the above-mentioned viewpoint and taking into consideration the relation with the functional characteristics of the layer region (I) 105 provided under the layer region 106.

Discharge power upon producing each of layer region (I) 105 and layer region (n) 106 is optionally determined depending upon the characteristics which each layer region is required to have and the device and the like. The discharge power is preferably 50–250 W, more preferably 80–150 W.

The layer thickness of layer region (n) 106 constituting a part of the first layer region 103 is optionally determined such that a desired acceptance potential can be obtained, photocarriers can be efficiently generated by irradiation of a light having a desired spectral characteristic and can be efficiently transported. The layer thickness of layer region (n) 106 is preferably 1–100 microns, more preferably 1–80 microns, most preferably 2–50 microns.

The layer thickness of layer region (I) 105 is determined with relation to the concentration of the impurity contained in layer region (I) 105 in such a manner that the required characteristics for achieving the object of the present invention is imparted to layer region (I) 105.

The layer thickness of layer region (I) 105 is preferably 0.01–10 microns, more preferably 0.05–8 microns, most preferably 0.07–5 microns.

The support temperature upon forming layer region (I) 105 and layer region (n) 106 may be appropriately determined. It is preferably 50°–350° C., more preferably 80°–300° C., most preferably 100°–300° C.

In FIG. 1, photoconductive member 100 has a second layer region 104 formed on the first layer region 103. The second layer region 140 has a free surface 107, and serves to improve mainly humidity resistance, continuous repeating use characteristics, dielectric strength, use environmental characteristics, and durability.

In the present invention, both the first and the second layer regions (103 and 104, respectively) constituting amorphous layer 102 are composed of a common material, that is, silicon as an amorphous material, so that the laminating interface is sufficiently chemically stable.

In the present invention, the second layer region 104 comprises an amorphous material selected from the group consisting of an amorphous material (1) composed of silicon and carbon atoms, $a\text{-}Si_aC_{1-a}$ ($0<a<1$), an amorphous material (2) composed of silicon, carbon and hydrogen atoms, $a\text{-}(Si_bC_{1-b})_cH_{1-c}$ ($0<b, c<1$), and an amorphous material (3) composed of silicon, carbon, and halogen (X) atoms, and if desired, additionally hydrogen atom, $a\text{-}(Si_dC_{1-d})_e(X, H)_{1-e}$ ($0<d, e<1$).

The second layer region 104 may be produced by glow discharge method, sputtering method, ion implantation method, ion plating method, electron beam method or the like. These methods are appropriately selected depending upon the production conditions, capital investment, scale of production, desired characteristics of the photoconductive member to be produced and the like.

When the second layer region 104 is produced by the amorphous material (1) as mentioned above, electron beam method, ion plating method, electron beam method and sputtering method are preferably employed since the production conditions for obtaining desired characteristics of the photoconductive members can be easily controlled and it is easy to introduce carbon atoms together with silicon atoms into the second layer region 104.

When the second layer region 104 is formed by using the above-mentioned amorphous material (2) or (3), glow discharge method or sputtering method is preferably used.

Further, the second layer region 104 may be formed by using a glow discharge method and a sputtering method in combination in a single apparatus.

When the second layer region 104 is formed with the above-mentioned amorphous material (1) by a sputtering method, a single crystalline or polycrystalline Si wafer and a C wafer, or a wafer containing both Si and C, is used as a target, and sputtering is effected in various gas atmospheres.

For example, when Si wafer and C wafer are used as targets, a sputtering gas such as He, Ne, Ar and the like is introduced into a deposition chamber for sputtering to form gas plasma, and sputtering is effected.

Alternatively, a single target composed of Si and C is used and a gas for sputtering is introduced into a deposition chamber to effect sputtering.

When an electron beam method is employed, a single crystalline or polycrystalline silicon of high purity and a graphite of high purity are placed separately in two boats, respectively followed by applying electron beams to the silicon and the graphite, respectively. Alternatively, both silicon and graphite at a desired ratio are placed in a single boat and a single electron beam is applied to effect deposition.

The ratio of silicon to carbon in the resulting second layer region 104 is controlled in the former by independently applying electron beams to the silicon and the graphite using different acceleration voltages, respectively while in the latter the ratio is controlled by determining preliminarily the amount ratio of silicon to graphite in the mixture.

When an ion plating method is used, a variety of gases are introduced into a deposition chamber and a high frequency electric field is preliminarily applied to a coil arranged around the chamber to cause a glow, and deposition of Si and C is effected by using an electron beam method.

When the second layer region 104 is produced by using a glow discharge method with the amorphous material (2), a starting gas for producing the above-mentioned amorphous material (2), if desired, mixed with a diluting gas at a predetermined ratio is introduced into a deposition chamber where a support 101 is placed, and the gas thus introduced is subjected to glow discharge to form a gas plasma, and the amorphous material (2) is deposited on the first layer region 103 already formed on the support 101.

As the gases for forming the amorphous material (2), there may be used most of gaseous or gasifiable materials which can supply Si, C and H.

Combinations of the materials are, for example, as shown below.

A starting gas containing Si as a constituting atom, a starting gas containing C as a constituting atom and a starting gas containing H as a constituting atom are mixed at a desired ratio and used.

Alternatively, a starting gas containing Si as a constituting atom and a starting gas containing C and H as constituting atoms are mixed at a desired ratio and used.

Further alternatively, a starting gas containing Si as a constituting atom and a gas containing Si, C and H as constituting atoms are mixed at a desired ratio and used.

Still further alternatively, a starting gas containing Si and H as constituting atoms and a starting gas containing C as a constituting atom are mixed at a desired ratio and used.

Starting gases used for forming effectively the amorphous material (2) include a silicon hydride gas containing Si and H as constituting atoms, for example, silanes such as $SiH_4$, $Si_2H_6$, $Si_3H_8$, $Si_4H_{10}$ and the like, and compounds containing C and H as constituting atoms, for example, saturated hydrocarbons of $C_{1-5}$, ethylenic hydrocarbons of $C_{2-5}$, acetylenic hydrocarbons of $C_{2-4}$ and the like.

More particularly, as saturated hydrocarbons, there may be mentioned methane, ethane, propane, n-butene, pentane, and the like. As ethylenic hydrocarbons, there may be mentioned ethylene, propylene, butene-1, butene-2, isobutylene, pentene and the like. As acetylenic hydrocarbons, there may be mentioned acetylene, methylacetylene, butyne and the like.

As starting gases containing Si, C and H as constituting atoms, there may be mentioned alkyl (silanes) such as $Si(CH_3)_4$, $Si(C_2H_5)_4$ and the like. Other than the above-mentioned starting gases, as a starting gas for introducing H, there may be naturally used $H_2$.

For producing the second layer region 104 by sputtering, a single crystalline or polycrystalline Si wafer, or C wafer, or a wafer containing both Si and C as a mixture is used as a target, and sputtering is effected in a variety of gas atmosphere.

For example, when an Si wafer is used as a target, starting gases for introducing C and H may be diluted by a diluting gas, if desired, and introduced into a deposition layer for sputtering the produce gas plasma of said gases and then sputtering is effected.

Alternatively, Si and C are made into separate targets or into one single target composed of a mixture of Si and C, and these targets are used in a gas atmosphere containing at least hydrogen atoms to conduct sputtering.

As starting gases for introducing C or H, the above-mentioned starting gases for glow discharge may be also used effectively for sputtering.

When the second layer region 104 is formed with the amorphous material (3), the procedures as mentioned concerning the formation of the second layer region 104 with the amorphous material (2) may be used except that at least a starting gas for introducing halogen atom (X) is used.

As halogen atoms (X) incorporated in the second layer region, F, Cl, Br and I may be used, and F and Cl are preferable.

It is preferable that the second layer region 104 composed of the amorphous material (3) contains hydrogen atoms as well as halogen atoms.

When hydrogen atom is incorporated in the second layer region 104, a part of the starting gases can be commonly used upon producing continuously the first layer region 103 and the second layer region, and therefore, the production cost can be lowered.

Starting gases for introducing halogen atom (X) effectively used for producing the second layer region 104 may be gaseous materials at ambient temperature and atmospheric pressure or easily gasifiable materials.

Such materials which can be starting gases for introducing halogen atom (X) for producing the second layer region 104 are: halogen, hydrogen halides, interhalogen compounds, silicon halides, halogen-substituted silicon hydrides and the like. As the above-mentioned halogen series materials, there may be particularly mentioned:

halogen gases such as fluorine, chlorine, bromine and iodine;
hydrogen halides such as HF, HI, HCl, and HBr;
interhalogen compounds such as BrF, ClF, $ClF_3$, $ClF_5$, $BrF_5$, $BrF_3$, $IF_7$, $IF_5$, ICl, IBr, and the like;
silicon halides such as $SiF_4$, $Si_2F_6$, $SiCl_4$, $SiCl_3Br$, $SiCl_2Br_2$, $SiClBr_3$, $SiCl_3I$, $SiBr_4$ and the like; and
halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$ and the like.

In addition, the halogen series materials include halogen substituted paraffin hydrocarbons such as $CCl_4$, $CHF_3$, $CH_2F_2$, $CH_3F$, $CH_3Cl$, $CH_3Br$, $CH_3I$, $C_2H_5Cl$ and the like; sulfur fluorides such as $SF_4$, $SF_6$ and the like; and silane derivatives, for example, halogen containing alkyl silanes such as $SiCl(CH_3)_3$, $SiCl_2(CH_3)_2$, $SiCl_3CH_3$ and the like.

The material for producing the second layer region 104 may be optionally selected upon forming the second layer region 104 in such a manner that silicon, carbon, halogen atoms, and if desired, hydrogen atoms, are incorporated in the second layer region 104 at a predetermined compoennt ratio.

For example, the second layer region 104 composed of a-$Si_xC_{1-x}$:Cl:H can be formed by introducing into an apparatus for producing the second layer region 104 a gaseous $Si(CH_3)_4$ capable of incorporating easily silicon, carbon and hydrogen atoms and a gaseous material capable of incorporating chlorine atom such as $SiHCl_3$, $SiCl_4$, $SiH_2Cl_2$, $SiH_3Cl$ and the like at a predetermined ratio followed by glow discharge, the $Si(CH_3)_4$ and the gaseous material capable of incorporating chlorine atom can form a second layer region 104 having desired characteristics.

As the diluting gas used upon forming the second layer region 104 by glow discharge or sputtering method, there may be mentioned preferably a rare gas such as He, Ne, Ar and the like.

The second layer region is formed carefully so as to impart desired characteristics thereto. That is, since the materials composed of Si and C, if desired, H and/or halogen as constituting atoms have a structure ranging from crystal to amorphous and exhibit electric properties ranging from electroconductivity to semiconductive property, and further to insulating property and also ranging from photoconductivity to nonphotoconductivity depending upon the conditions for formation of the materials, it is preferable to select the conditions strictly so as to obtain the desired properties of the amorphous materials (1), (2) or (3) achieving the object of the invention.

For example, in case that the second layer region 104 is provided for improving mainly the dielectric strength, the amorphous materials (1), (2) or (3) formed should be remarkably electrically insulating under the use environment.

Further, in case that the second layer region 104 is provided for improving mainly the continuous repeating use characteristics and the use environment characteristics, the degree of electrical insulating property as mentioned above may be somewhat low, and it is sufficient for the purpose that the amorphous materials (1), (2) or (3) formed have a sensitivity to an irradiating light to some extent.

Upon forming a second layer 104 region composed of the above-mentioned amorphous materials (1), (2) or (3) on a first layer region 103, the support temperature during forming the layer region is an important factor affecting the constitution and characteristics of the resulting layer. Therefore, it is preferable to control strictly the support temperature so as to impart desired characteristics to the amorphous materials (1), (2) or (3).

The support temperature is appropriately selected depending upon the type of process for forming the second layer region 104.

When the second layer region 104 is formed with the amorphous material (1), the temperature is preferably 20°-300° C., more preferably 20°-250° C.

When the second layer region 104 is formed with the amorphous material (2) or (3), the temperature upon a glow discharge method is preferably 100°-300° C., more preferably 150°-250° C., and the temperature upon a sputtering method is preferably 20°-300° C., more preferably 20°-250° C.

In the case of forming the second layer region 104 composed of the amorphous material (1), sputtering methods and electron beam methods are advantageous since controlling delicately the atomic composition ratio of the atoms constituting the layer region and controlling the layer thickness as compared with other methods.

In the case of forming the second layer region 104 composed of the amorphous material (2) or (3), glow discharge methods and sputtering methods are preferably employed, and the discharge power upon layer formation as well as the support temperature is an important factor affecting the characteristics of the amorphous material formed.

For the purpose of producing effectively the above-mentioned amorphous material constituting the second layer region 104 having the desirable characteristics at a good productivity, the discharge power is preferably 50–250 W, more preferably 80–150 W in the case of the amorphous material (1), and is preferably 10–300 W, more preferably 20–200 W in the case of the amorphous material (2) or (3).

The gas pressure in the deposition chamber is usually 0.01–5 torr, preferably 0.01–3 torr, and more preferably 0.05–1 torr.

Preferable ranges of the support temperature and the discharge power for producing the second layer region 104 are mentioned as above.

It is not preferable to select those values separately or independently, but it is preferable to select the values mutually dependently with an intimate relation between them so as to produce the second layer region 104 composed of the amorphous material having desirable characteristics.

The contents of carbon atoms and other atoms contained in the second layer region 104 as well as the above-mentioned second layer region 104 is forming conditions are also important factors to obtain the layer having desirable characteristics to attain the object of the present invention.

When the second layer region 104 is formed with the amorphous material (1), the amount of carbon atoms contained in the second layer region 104 is preferably $1 \times 10^{-3}$–10 atomic %, more preferably 1–80 atomic %, most preferably 10–75 atomic %.

In the case of a-$Si_aC_{1-a}$, the value of a is preferably 0.1–0.99999, more preferably 0.2–0.99, most preferably 0.25–0.9.

When the second layer region 104 is formed with the amorphous material (2), the amount of carbon atoms contained in the second layer region 104 is preferably $1 \times 10^{-3}$–90 atomic %, more preferably 1–90 atomic %, most preferably 10–80 atomic %.

The amount of hydrogen atoms is preferably 1–40 atomic %, more preferably 2–35 atomic %, most preferably 5–30 atomic %. When the hydrogen content is within the above-mentioned range, the resulting photoconductive member is very good for practical uses.

In terms of a-$(Si_bC_{1-b})_cH_{1-c}$, the value of b is preferably 0.1–0.99999, more preferably 0.1–0.99, most preferably 0.15–0.9, and the value of c is preferably 0.6–0.99, more preferably 0.65–0.98, most preferably 0.7–0.95.

When the second layer region 104 is formed with the amorphous material (3), the amount of carbon atoms and halogen atoms contained in the second layer region 104 as well as the conditions for producing the region 104 are important factors to obtain the desired characteristics of the region 104 for achieving the object of the present invention.

The amount of carbon atoms contained in the second layer region 104 is preferably $1 \times 10^{-3}$–90 atomic %, more preferably 1–90 atomic %, most preferably 10–80 atomic %.

The amount of halogen atoms is preferably 1–20 atomic %, more preferably 1–18 atomic %, most preferably 2–15 atomic %. Where the halogen content is within the above-mentioned range, the resulting photoconductive member is very good for practical uses. The amount of hydrogen atoms which are contained if desired is preferably 19 atomic % or less, more preferably 13 atomic % or less.

In terms of a-$(Si_dC_{1-d})_eX_{1-e}$, the value of d is preferably 0.1–0.99999, more preferably 0.1–0.99, most preferably 0.15–0.9, and the value of e is preferably 0.8–0.99, more preferably 0.82–0.99, most preferably 0.85–0.98.

The range of layer thickness in the present invention is a very important factor to achieve the object of the present invention.

The thickness of the second layer region 104 may be appropriately selected so as to achieve the purpose of the present invention effectively.

The thickness of the second layer region 104 may be appropriately determined depending on the relation with the thickness of the first layer region 103 and economical conditions such as productivity, mass production and the like.

The thickness of the second layer region 104 is preferably 0.01–10 microns, more preferably 0.02–5 microns, most preferably 0.04–5 microns.

The relation of layer thickness between the first layer region 103 and the second layer region 104 constituting the amorphous layer 102 of the photoconductive member 100 of the present invention may be appropriately determined depending on the applications such as reading devices, image pick-up devices, image forming members for electrophotography and the like.

The thickness of the amorphous layer may be appropriately determined depending on the relation between the thickness of the first layer region 103 and that of the second layer region 104 constituting the amorphous layer 102 so that the characteristics of each of the first layer region and the second layer region can be effectively exhibited. The thickness of the first layer region 103 is preferably from several hundreds to several thousands or more times the thickness of the second layer region 104.

The photoconductive members according to the present invention may be produced as shown below.

Figure 2:
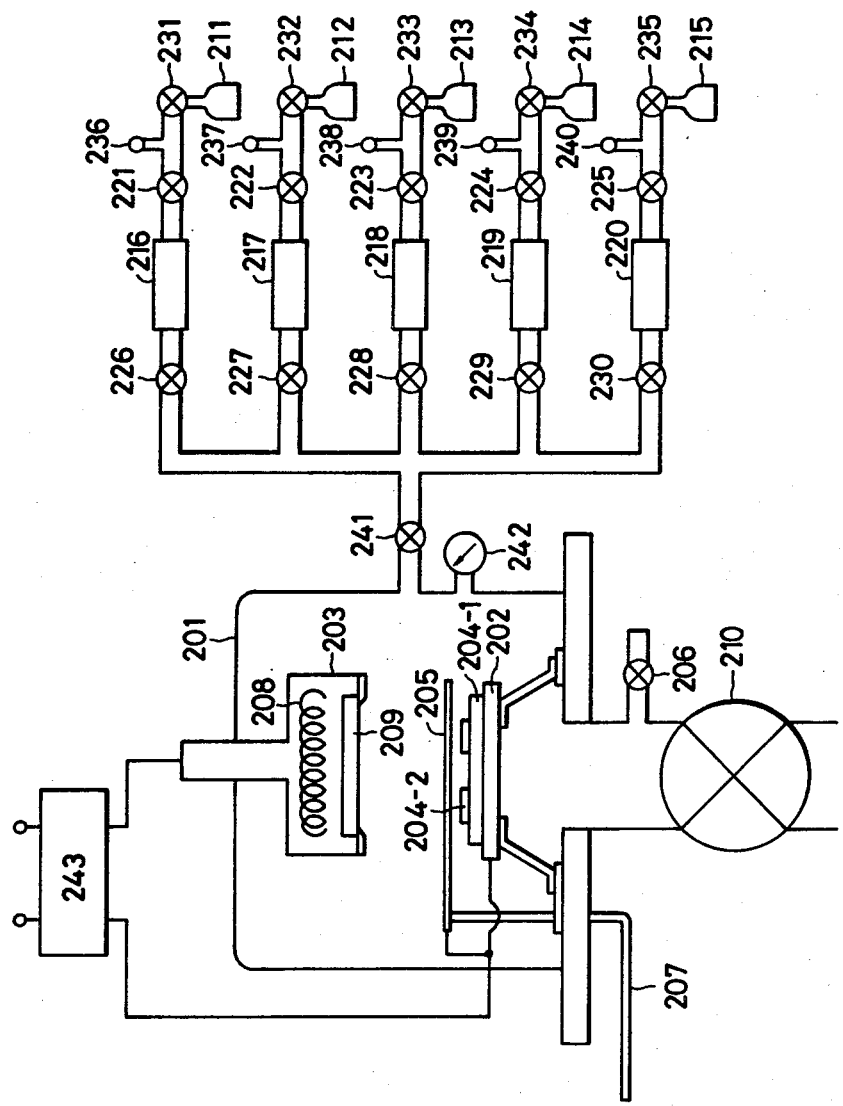
FIG. 2 schematically shows a device which may be used for producing the photoconductive member of the present invention.

Referring to FIG. 2 showing a device for producing a photoconductive member to the present invention.

In gas bombs 211–215, there are hermetically contained starting gases for producing respective layer regions of the photoconductive member of the present invention. For example, bomb 211 contains $SiH_4$ gas (purity: 99.999%) diluted with He (hereinafter referred to as "$SiH_4$/He"), bomb 212 contains $B_2H_6$ gas (purity: 99.999%) diluted with He (hereinafter referred to as "$B_2H_6$/He"), bomb 213 contains $Si_2H_6$ gas (purity: 99.99%) diluted with He (hereinafter referred to as "$Si_2H_6$/He"), bomb 214 contains $SiF_4$ gas (purity: 99.999%) diluted with He (hereinafter referred to as "$SiF_4$/He"), and bomb 215 contains Ar.

For allowing these gases to flow into a rection chamber 201, after confirming that valves 231–235 of gas bombs 211–215 and a leak valve 206 are closed and inflow valves 221–225, outflow valves 226–230, and an auxiliary valve 241 are opened, a main valve 210 is firstly opened to evacuate the reaction chamber 201 and the gas pipeline. When the reading on a vacuum indicator 242 becomes about $5 \times 10^{-6}$ Torr, auxiliary valve 241 and outflow valves 226–230 are closed.

An embodiment of forming a first layer region on a substrate 209 is as shown below.

A shutter 205 is closed and is connected such that a high voltage power can be applied from a power source 243.

$SiH_4$/He gas from bomb 211 and $B_2H_6$/He gas from bomb 212 are permitted to flow into mass-flow controllers 216 and 217 by opening valves 231 and 232 to control outlet pressure gauges 236 and 237 to 1 Kg/cm² and opening gradually inflow valves 221 and 222, respectively. Then, outflow valves 226 and 227 and auxiliary valve 241 are gradually opened to permit the respective gases to flow into reaction chamber 201. Outflow valves 226 and 227 are controlled so that the flow rate ratio of $SiH_4$/He gas to $B_2H_6$/He gas may have a desired value, and opening of main valve 210 is also controlled watching the reading of vacuum indicator 242 so that the pressure in reaction chamber 201 may reach a desired value. Then, after confirming that the temperature of substrate 209 is 50°–400° C. by a heater 208, a power source 243 is set at a desired power to cause glow discharge in reaction chamber 201 for a desired period of time to form a layer region (I) of a first layer region on substrate.

Then, simultaneously with interruption of glow discharge, the predetermined valve is closed to stop introducing $B_2H_6$/He gas into the reaction chamber 201, and then glow discharge is continued in the reaction chamber 201 for a desired period of time to form a layer region (n) of a desired layer thickness.

For incorporating halogen atoms in the first layer region, for example, $SiF_4$/He gas is added to the above-mentioned gases for forming the first layer region so as to feed $SiF_4$/He gas into the reaction chamber.

A second layer region may be formed on the first layer region as shown below.

Shutter 205 is opened, and all gas feeding valves are once closed and reaction chamber 201 is evacuated by fully opening main valve 210. High purity silicon wafer 204-1 and high purity graphite 204-2 are placed on an electrode 202 to which a high voltage power is applied, at a desired area ratio. From bomb 215, Ar gas is introduced into reaction chamber 201, and main valve 210 is controlled so that the inner pressure of the reaction chamber may become 0.05–1 Torr. The high voltage power source is switched on to effect sputtering by using silicon and graphite simultaneously. As a result, the second layer region composed of the amorphous material (1) is formed on the first layer region.

When the second layer region is formed with the amorphous material (2) or the amorphous material (3), for example, the above-mentioned method of producing the second layer region composed of the amorphous material (1) may be effected by additionally introducing a starting gas for introducing hydrogen atom such as $H_2$, $SiH_4$ and the like and/or a starting gas for introducing halogen atom such as $F_2$, $SiF_4$ and the like into the reaction chamber.

When the second layer region is formed by glow discharge method, for example, $CH_4$, $C_2H_4$ or the like gas in addition to $SiH_4$ gas or the like, or $CH_4$ and $SiF_4$ or the like in addition to $SiH_4$ gas or the like is introduced into the reaction chamber to decompose these gases by glow discharge.

As mentioned above in detail, the photoconductive member according to the present invention can solve various problems of the prior art, and exhibits excellent electrical, optical, and photoconductive characteristics, durability, and use environmental characteristics.

In particular, when the photoconductive member is used as an image forming member for electrophotography, there is not any effect of residual potential on the image formation, and the electric characteristics are stable and the sensitivity and SN ratio are high, and further, light fatigue resistance, repeating use characteristics, humidity resistance, and dielectric strength are also high. Therefore, there can be repeatedly and stably obtained images of high density, clear half tone, high resolution, and high quality.

EXAMPLE 1

TABLE 1

|  | Used gas | Flow rate (SCCM) | Layer forming rate (Å/S) | Layer thickness | Discharge power (W/cm²) | Support temperature (°C.) | Pressure upon reaction (torr) | Discharge frequency (MHz) |
| --- | --- | --- | --- | --- | --- | --- | --- | --- |
| Layer region (I) | $SiH_4/He$ = 0.5 $B_2H_6/He$ = $3 \times 10^{-3}$ | $SiH_4$ = 200 Changing suitably | 16 | Changing suitably | 0.2 | 250 | 0.5 | 13.56 |

TABLE 2

|  | Used gas | Flow rate (SCCM) | Layer forming rate (Å/S) | Layer thickness (μm) | Discharge power (W/cm²) | Support temperature (°C.) | Pressure upon reaction (torr) | Discharge frequency (MHz) |
| --- | --- | --- | --- | --- | --- | --- | --- | --- |
| Layer region (n) | $SiH_4/He$ = 0.5 | $SiH_4$ = 200 | 16 | 20 | 0.2 | 250 | 0.5 | 13.56 |

TABLE 3

|  | Used target and gas | Area ratio | Layer forming rate (Å/S) | Layer thickness (Å) | Discharge power (W/cm²) | Support temperature (°C.) | Pressure upon reaction (torr) | Discharge frequency (MHz) |
| --- | --- | --- | --- | --- | --- | --- | --- | --- |
| Layer region (C) | Si Graphite (C) Ar | Si:C = 3:7 | 3 | 5000 | 1.0 | 50 | $1 \times 10^{-2}$ | 13.56 |

TABLE 4

| Layer thickness of layer region (I) (μ) | Content of B (atomic ppm) | | | | | | | | | | |
| --- | --- | --- | --- | --- | --- | --- | --- | --- | --- | --- | --- |
|  | 1.0 | 5.0 | 10 | 50 | 100 | 500 | $1 \times 10^3$ | $2 \times 10^3$ | $5 \times 10^3$ | $1 \times 10^4$ | $3 \times 10^4$ |
| 0.01 | C | C | C | C | B | B | B | A | A | A | A |
| 0.05 | C | C | C | B | B | B | A | A | A | A | A |
| 0.1 | C | C | B | B | A | A | A | A | A | A | A |
| 0.2 | C | C | B | A | A | A | A | A | A | A | A |
| 0.3 | B | B | A | A | A | A | A | A | A | A | D |
| 0.5 | B | B | A | A | A | A | A | A | A | D | D |
| 0.7 | B | B | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |
| 10.0 | A | A | A | A | D | D | D | D | D | D | D |

Evaluation standard
A: Excellent
B: Good
C: Practically sufficiently usable
D: Practically usable By using the apparatus in FIG. 2, a layer was formed on an Al support by varying the layer thickness of the layer region (I) and content of boron atom (B) in the layer region (I).

The common conditions for producing the layer region (I) is shown in Table 1. For each sample, the layer region (n) was deposited under the conditions in Table 2 and the layer region (C) was deposited under the conditions in Table 3.

The resulting image forming member for electrophotography was set in a copying apparatus and development was conducted under the developing conditions in Table 5. The images thus developed were transferred to a plain paper and fixed.

A series of steps as mentioned above was continuously repeated to produce many sheets of transferred images.

The first sheet of copy and the 100,000th sheet of copy were compared by overall evaluation of density, resolution, tone reproducibility and defective image. The results were as shown in Table 4.

TABLE 5

| | |
| --- | --- |
| Corona voltage | +5 KV |
| Corona applying time | 0.2 sec |
| Light source | Tungsten lamp |
| Light quantity | 1.0 lux · sec |
| Toner polarity | Negative |

EXAMPLE 2

Under the conditions in Table 6 and Table 2, layer region (I) and layer region (n) were subsequently formed on an Al support, and then layer region (C) was formed thereon by varying the content of C atom in layer region (C) and the layer thickness of layer region (C). The layer region (C) was formed under the conditions of Table 3 except that the layer thickness was changed.

The resulting image forming members for electrophotography were evaluated in the same way as in Example 1 and the results were as shown in Table 7.

TABLE 6

| | Used gas | Flow rate (SCCM) | Layer forming rate (Å/S) | Layer thickness (Å) | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5 B$_2$H$_6$/He = 3 × 10$^{-3}$ | SiH$_4$ = 200 B$_2$H$_6$ = 0.2 | 16 | 3000 | 0.2 | 250 | 0.5 | 13.56 |

TABLE 7

| Layer thickness of layer region (C) (μ) | Area ratio of Si:C | | | | | | |
|---|---|---|---|---|---|---|---|
| | 9.8:0.2 | 9:1 | 8.4:1.6 | 7.3:2.7 | 4:6 | 2.3:7.7 | 1:9 |
| | Content of C in the Layer (atomic %) | | | | | | |
| | 1 | 3 | 5 | 10 | 30 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |
| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

EXAMPLE 3

Under the conditions in Table 6, layer region (I) was formed on an Al support, and then, layer region (n) was formed thereon by varying layer thickness. Further, layer region (C) was formed under the conditions in Table 3.

Upon forming layer region (n), the conditions were the same as those in Table 2 except that the layer thickness was varied. The resulting image forming members for electrophotography were evaluated in the same way as in Example 1. The results are shown in Table 8.

TABLE 8

| Layer thickness of layer region (n) (μ) | 0.5 | 1.0 | 1.5 | 2.0 | 5.0 | 10 | 20 | 50 | 70 | 80 |
|---|---|---|---|---|---|---|---|---|---|---|
| Evaluation | D | C | B | A | A | A | A | A | B | B |

EXAMPLE 4

By using the production apparatus in FIG. 2, layer region (I) was formed on an Al cylinder support by varying the layer thickness of and the content of phosphorus atom (P) in layer region (I). The common conditions for producing the layer region (I) were as shown in Table 9. Then, for each sample, the layer region (n) and the layer region (C) were formed under the conditions in Table 2 and the conditions in Table 3, respectively.

The resulting image forming members for electrophotography were evaluated in the same manner as in Example 1. The results are shown in Table 10.

TABLE 9

| | Used gas | Flow rate (SCCM) | Layer forming rate (Å/S) | Layer thickness | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5 PH$_3$/He = 3 × 10$^{-3}$ | SiH$_4$ = 200 Changing suitably | 16 | Changing suitably | 0.2 | 250 | 0.5 | 13.56 |

TABLE 10

| Layer thickness of layer region (I) (μ) | Content of P (atomic ppm) | | | | | | | | |
|---|---|---|---|---|---|---|---|---|---|
| | 0.1 | 0.5 | 1.0 | 50 | 100 | 200 | 500 | 800 | 10$^3$ | 5 × 10$^3$ |
| 0.01 | D | D | C | C | C | C | B | B | A | A |
| 0.05 | D | C | C | C | B | B | A | A | A | A |
| 0.1 | C | C | C | B | A | A | A | A | A | A |
| 0.2 | C | C | B | A | A | A | A | A | A | B |
| 0.3 | B | B | B | A | A | A | A | A | A | B |
| 0.5 | B | B | B | A | A | A | A | A | B | C |
| 0.7 | B | B | A | A | A | A | A | A | B | C |
| 1.0 | A | A | A | A | A | A | A | B | C | D |
| 2.0 | A | A | A | A | A | A | B | C | D | D |
| 5.0 | A | A | A | A | A | A | B | D | D | D |
| 10.0 | A | A | A | A | B | B | D | D | D | D |

EXAMPLE 5

Under the conditions in Table 11 and Table 2, layer region (I) and layer region (n) were subsequently formed on an aluminum support, and then layer region (C) was formed by varying the content of C atom and layer thickness of layer region (C). Layer region (C) was formed under the same conditions as in Table 3 except that the layer thickness was varied.

The resulting electrophotographic image forming members were evaluated in the same way as in Example 1. The results are shown in Table 12.

TABLE 11

| | Used gas | Flow rate (SCCM) | Layer forming rate (Å/S) | Layer thickness (Å) | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5<br>PH$_3$/He = 3 × 10$^{-3}$ | SiH$_4$ = 200<br>PH$_3$ = 0.01 | 16 | 3000 | 0.2 | 250 | 0.5 | 13.56 |

TABLE 12

| Layer thickness of layer region (C) (μ) | Area ratio of Si:C | | | | | | |
|---|---|---|---|---|---|---|---|
| | 9.8:0.2 | 9:1 | 8.4:1.6 | 7.3:2.7 | 4:6 | 2.3:7.7 | 1:9 |
| | Content of C atom in the layer (atomic %) | | | | | | |
| | 1 | 3 | 5 | 10 | 30 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |
| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

EXAMPLE 6

Under the conditions in Table 11, layer region (I) was formed on an Al support, and layer regions (n) were formed with various layer thicknesses. Then layer region (C) was formed on each of the layer regions (n) under the conditions in Table 3. Upon forming layer region (n), the conditions in Table 2 were employed except that the layer thickness was varied.

The resulting electrophotographic image forming members were evaluated in the same manner as in Example 1. The results are shown in Table 13.

TABLE 13

| Layer thickness of layer region (n) (μ) | 0.5 | 1.0 | 1.5 | 2.0 | 5.0 | 10 | 20 | 50 | 70 | 80 |
|---|---|---|---|---|---|---|---|---|---|---|
| Evaluation | D | C | B | A | A | A | A | A | B | B |

EXAMPLE 7

Layer formation was effected by repeating Example 1 except that formations of layer region (I) and layer region (n) were changed as shown in Table 14 and Table 15, respectively. The resulting members were evaluated in the same manner as in Example 1. The results are shown in Table 16.

TABLE 14

| | Used gas | Flow rate (SCCM) | Flow rate ratio | Discharge power (W/cm$^2$) | Layer deposition rate (Å/sec) | Layer thickness (μ) |
|---|---|---|---|---|---|---|
| Layer region (I) | SiH$_4$/He = 0.5<br>SiF$_4$/He = 0.5<br>B$_2$H$_6$/He = 3 × 10$^{-3}$ | (SiH$_4$ + SiF$_4$) = 150<br>B$_2$H$_6$ Changing suitably | SiH$_4$:SiF$_4$ = 8:2 | 0.18 | 9 | Changing suitably |

TABLE 15

| | Used gas | Flow rate (SCCM) | Flow rate ratio | Discharge power (W/cm$^2$) | Layer deposition rate (Å/sec) | Layer thickness (μ) |
|---|---|---|---|---|---|---|
| Layer region (n) | SiH$_4$/He = 0.5<br>SiF$_4$/He = 0.5 | (SiH$_4$ + SiF$_4$) = 150 | SiH$_4$:SiF$_4$ = 8:2 | 0.18 | 9 | 20 |

TABLE 16

| Layer thickness of layer region (I) (μ) | Content of B (atomic ppm) | | | | | | | | | | |
|---|---|---|---|---|---|---|---|---|---|---|---|
| | 1.0 | 5.0 | 10 | 50 | 100 | 500 | 1 × 10$^3$ | 2 × 10$^3$ | 5 × 10$^3$ | 1 × 10$^4$ | 3 × 10$^4$ |
| 0.01 | C | C | C | B | B | B | A | A | A | A | A |
| 0.05 | C | C | B | B | B | A | A | A | A | A | A |
| 0.1 | C | C | B | A | A | A | A | A | A | A | A |
| 0.2 | B | B | B | A | A | A | A | A | A | A | A |
| 0.3 | B | B | A | A | A | A | A | A | A | A | D |
| 0.5 | B | B | A | A | A | A | A | A | A | D | D |
| 0.7 | B | A | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |

TABLE 16-continued

| Layer thickness of layer region (I) (μ) | Content of B (atomic ppm) | | | | | | | | | | |
|---|---|---|---|---|---|---|---|---|---|---|---|
| | 1.0 | 5.0 | 10 | 50 | 100 | 500 | $1 \times 10^3$ | $2 \times 10^3$ | $5 \times 10^3$ | $1 \times 10^4$ | $3 \times 10^4$ |
| 10.0 | A | A | A | A | D | D | D | D | D | D | D |

EXAMPLE 8

By using the apparatus in FIG. 2, layer formation was effected on an Al support by varying the layer thickness of layer region (I) and the boron atom (B) content in layer region (I). The common production conditions for layer region (I) are shown in Table 17. On each sample, there were formed layer region (n) under the conditions in Table 18 and layer region (C) under the conditions in Table 19.

The resulting electrophotographic image forming members were set in the same copying machine as in Example 1, and the development was effected under the conditions in Table 5. Then the images thus developed were transferred to a plain paper and fixed. By repeating continuously a series of steps as mentioned above to produce a number of sheets of transferred images. The resulting image samples were evaluated in the same manner as in Example 1. The results are shown in Table 20.

TABLE 17

| | Used gas | Flow rate (SCCM) | Layer forming rate (Å/S) | Layer thickness (μ) | Discharge power (W/cm²) | Support temperature (°C.) | Pressure upon reaction (torr) | Discharge frequency (MHz) |
|---|---|---|---|---|---|---|---|---|
| Layer region (I) | $SiH_4/He = 0.5$ $B_2H_6/He = 3 \times 10^{-3}$ | $SiH_4 = 200$ Changing suitably | 16 | Changing suitably | 0.2 | 250 | 0.5 | 13.56 |

TABLE 18

| | Used gas | Flow rate (SCCM) | Layer forming rate (Å/S) | Layer thickness (μ) | Discharge power (W/cm²) | Support temperature (°C.) | Pressure upon reaction (torr) | Discharge frequency (MHz) |
|---|---|---|---|---|---|---|---|---|
| Layer region (n) | $SiH_4/He = 0.5$ | $SiH_4 = 200$ | 16 | 20 | 0.2 | 250 | 0.5 | 13.56 |

TABLE 19

| | Used gas | Flow rate (SCCM) | Layer forming rate (Å/S) | Layer thickness (μ) | Discharge power (W/cm²) | Support temperature (°C.) | Pressure upon reaction (torr) | Discharge frequency (MHz) |
|---|---|---|---|---|---|---|---|---|
| Layer region (C) | $SiH_4/He = 0.5$ $C_2H_4$ | $SiH_4 = 100$ $C_2H_4 = 66.7$ | 6 | 2 | 0.18 | 250 | 0.45 | 13.56 |

TABLE 20

| Layer thickness of layer region (I) (μ) | Content of B (atomic ppm) | | | | | | | | | | |
|---|---|---|---|---|---|---|---|---|---|---|---|
| | 1 | 5 | 10 | 50 | 100 | 500 | $1 \times 10^3$ | $2 \times 10^3$ | $5 \times 10^3$ | $1 \times 10^4$ | $3 \times 10^4$ |
| 0.01 | C | C | C | C | B | B | B | A | A | A | A |
| 0.05 | C | C | C | B | B | B | A | A | A | A | A |
| 0.1 | C | C | B | B | A | A | A | A | A | A | A |
| 0.2 | C | C | B | A | A | A | A | A | A | A | A |
| 0.3 | B | B | A | A | A | A | A | A | A | A | D |
| 0.5 | B | B | A | A | A | A | A | A | A | D | D |
| 0.7 | B | B | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |
| 10.0 | A | A | A | A | D | D | D | D | D | D | D |

EXAMPLE 9

Under the conditions in Table 21 and Table 18, layer region (I) and layer region (n) were subsequently formed on an Al support, respectively. Then, layer region (C) was formed on the above-mentioned layer region (n) by varying the content of carbon atom in layer region (C) and layer thickness of layer region (C).

The layer region (C) was produced under the conditions in Table 19 except that the layer thickness and content of carbon atom were changed.

The resulting electrophotographic image forming members were evaluated in the same way as in Example 1. The results are shown in Table 22.

TABLE 21

| | Used gas | Flow rate (SCCM) | Layer forming rate (Å/S) | Layer thickness (Å) | Discharge power (W/cm²) | Support temperature (°C.) | Pressure upon reaction (torr) | Discharge frequency (MHz) |
| --- | --- | --- | --- | --- | --- | --- | --- | --- |
| Layer region (I) | SiH₄/He = 0.5  B₂H₆/He = 3 × 10⁻³ | SiH₄ = 200  B₂H₆ = 0.2 | 16 | 3000 | 0.2 | 250 | 0.5 | 13.56 |

TABLE 23

| Layer thickness of layer region (n) (μ) | 0.5 | 1.0 | 1.5 | 2.0 | 5.0 | 10 | 20 | 50 | 70 | 80 |
| --- | --- | --- | --- | --- | --- | --- | --- | --- | --- | --- |
| Evaluation | D | C | B | A | A | A | A | A | B | B |

TABLE 24

| | Used gas | Flow rate (SCCM) | Layer forming rate (Å/S) | Layer thickness (μ) | Discharge power (W/cm²) | Support temperature (°C.) | Pressure upon reaction (torr) | Discharge frequency (MHz) |
| --- | --- | --- | --- | --- | --- | --- | --- | --- |
| Layer region (I) | SiH₄/He = 0.5  PH₃/He = 3 × 10⁻³ | SiH₄ = 200  PH₃ = Changing suitably | 16 | Changing suitably | 0.2 | 250 | 0.5 | 13.56 |

TABLE 22

| Layer thickness of layer region (C) (μ) | Flow rate ratio of SiH₄ to C₂H₄ | | | | | | |
| --- | --- | --- | --- | --- | --- | --- | --- |
| | 9.99: 0.01 | 9.95: 0.05 | 9.9: 0.1 | 9.5: 0.5 | 8.5: 1.5 | 3.5: 6.5 | 1:9 |
| | Content of C atom in the layer (atomic %) | | | | | | |
| | 1 | 3 | 5 | 10 | 20 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |
| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

TABLE 25

| Layer thickness of layer region (I) (μ) | Content of P (atomic ppm) | | | | | | | | | |
| --- | --- | --- | --- | --- | --- | --- | --- | --- | --- | --- |
| | 0.1 | 0.5 | 1.0 | 50 | 100 | 200 | 500 | 800 | 10³ | 5 × 10³ |
| 0.01 | D | D | C | C | C | C | B | B | A | A |
| 0.05 | D | C | C | C | B | B | A | A | A | A |
| 0.1 | C | C | C | B | A | A | A | A | A | A |
| 0.2 | C | C | B | A | A | A | A | A | A | B |
| 0.3 | B | B | B | A | A | A | A | A | A | B |
| 0.5 | B | B | A | A | A | A | A | A | B | C |
| 0.7 | B | B | A | A | A | A | A | A | B | C |
| 1.0 | A | A | A | A | A | A | A | B | C | D |
| 2.0 | A | A | A | A | A | A | B | C | D | D |
| 5.0 | A | A | A | A | A | A | B | D | D | D |
| 10.0 | A | A | A | A | B | B | D | D | D | D |

TABLE 26

| | Used gas | Flow rate (SCCM) | Layer forming rate (Å/S) | Layer thickness (Å) | Discharge power (W/cm²) | Support temperature (°C.) | Pressure upon reaction (torr) | Discharge frequency (MHz) |
| --- | --- | --- | --- | --- | --- | --- | --- | --- |
| Layer region (I) | SiH₄/He = 0.5  PH₃/He = 3 × 10³ | SiH₄ = 200  PH₃ = 0.01 | 16 | 3000 | 0.2 | 250 | 0.5 | 13.56 |

EXAMPLE 10

Under the conditions in Table 21, layer region (I) was formed on an Al support, and then, layer region (n) was formed on layer region (I) by varying the layer thickness, and further, layer region (C) was formed under the conditions in Table 19.

Upon forming the layer region (n), the conditions were the same as in Table 18 except that the layer thickness was varied.

The resulting electrophotographic image forming members were evaluated in the same manner as in Example 1. The results are shown in Table 23.

TABLE 27

| Layer thickness of layer region (C) (μ) | Flow rate ratio of SiH₄ to C₂H₄ | | | | | | |
| --- | --- | --- | --- | --- | --- | --- | --- |
| | 9.99: 0.01 | 9.95: 0.05 | 9.9: 0.1 | 9.5: 0.5 | 8.5: 1.5 | 3.5: 6.5 | 1:9 |
| | Content of C atom in the layer (atomic %) | | | | | | |
| | 1 | 3 | 5 | 10 | 20 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |

TABLE 27-continued

| Layer thickness of layer region (C) (μ) | Flow rate ratio of SiH$_4$ to C$_2$H$_4$ | | | | | | |
|---|---|---|---|---|---|---|---|
| | 9.99: 0.01 | 9.95: 0.05 | 9.9: 0.1 | 9.5: 0.5 | 8.5: 1.5 | 3.5: 6.5 | 1:9 |
| | Content of C atom in the layer (atomic %) | | | | | | |
| | 1 | 3 | 5 | 10 | 20 | 50 | 70 |

TABLE 28

| Layer thickness of layer region (n) (μ) | 0.5 | 1.0 | 1.5 | 2.0 | 5.0 | 10 | 20 | 50 | 70 | 80 |
|---|---|---|---|---|---|---|---|---|---|---|
| Evaluation | D | C | B | A | A | A | A | A | B | B |

TABLE 29

| | Used gas | Flow rate (SCCM) | Flow rate ratio | Discharge power (W/cm$^2$) | Layer deposition rate (Å/sec) | Layer thickness (μ) |
|---|---|---|---|---|---|---|
| Layer region (I) | SiH$_4$/He = 0.5<br>SiF$_4$/He = 0.5<br>B$_2$H$_6$/He = 3 × 10$^{-3}$ | (SiH$_4$ + SiF$_4$) = 150<br>B$_2$H$_6$ Changing suitably | SiH$_4$:SiF$_4$ = 8:2 | 0.18 | 9 | Changing suitably |

TABLE 30

| | Used gas | Flow rate (SCCM) | Flow rate ratio | Discharge power (W/cm$^2$) | Layer deposition rate (Å/sec) | Layer thickness (μ) |
|---|---|---|---|---|---|---|
| Layer region (n) | SiH$_4$/He = 0.5<br>SiF$_4$/He = 0.5 | (SiH$_4$ + SiF$_4$) = 150 | SiH$_4$:SiF$_4$ = 8:2 | 0.18 | 9 | 20 |

TABLE 31

| Layer thickness of layer region (I) (μ) | Content of B (atomic ppm) | | | | | | | | | | |
|---|---|---|---|---|---|---|---|---|---|---|---|
| | 1.0 | 5.0 | 10 | 50 | 100 | 500 | 1 × 10$^3$ | 2 × 10$^3$ | 5 × 10$^3$ | 1 × 10$^4$ | 3 × 10$^4$ |
| 0.01 | C | C | C | B | B | B | A | A | A | A | A |
| 0.05 | C | C | B | B | B | A | A | A | A | A | A |
| 0.1 | C | C | B | A | A | A | A | A | A | A | A |
| 0.2 | B | B | B | A | A | A | A | A | A | A | A |
| 0.3 | B | B | A | A | A | A | A | A | A | A | D |
| 0.5 | B | B | A | A | A | A | A | A | A | D | D |
| 0.7 | B | A | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |
| 10.0 | A | A | A | A | D | D | D | D | D | D | D |

TABLE 32

| | Used gas | Flow rate (SCCM) | Layer forming rate (Å/S) | Layer thickness (μ) | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5<br>B$_2$H$_6$/He = 3 × 10$^{-3}$ | SiH$_4$ = 200<br>Changing suitably | 16 | Changing suitably | 0.2 | 250 | 0.5 | 13.56 |

| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

TABLE 33

| | Used gas | Flow rate (SCCM) | Layer forming rate (Å/S) | Layer thickness (μ) | Discharge power (W/cm$^2$) | Support temperature (°C.) | Pressure upon reaction (torr) | Discharge frequency (MHz) |
|---|---|---|---|---|---|---|---|---|
| Layer region (n) | SiH$_4$/He = 0.5 | SiH$_4$ = 200 | 16 | 20 | 0.2 | 250 | 0.5 | 13.56 |

TABLE 34

| | Used gas | Flow rate (SCCM) | Layer forming rate (Å/S) | Layer thickness (μ) | Discharge power (W/cm$^2$) | Support temperature (°C.) | Pressure upon reaction (torr) | Discharge frequency (MHz) |
|---|---|---|---|---|---|---|---|---|
| Layer region (C) | SiH$_4$/He = 0.5<br>SiF$_4$/He = 0.5<br>C$_2$H$_4$ | SiH$_4$ + SiF$_4$ = 150<br>C$_2$H$_4$ = 100 | 8 | 2 | 0.18 | 250 | 0.5 | 13.56 |

TABLE 35

| Layer thickness of layer region (I) (μ) | Content of B (atomic ppm) | | | | | | | | | | |
|---|---|---|---|---|---|---|---|---|---|---|---|
| | 1.0 | 5.0 | 10 | 50 | 100 | 500 | 1 × 10$^3$ | 2 × 10$^3$ | 5 × 10$^3$ | 1 × 10$^4$ | 3 × 10$^4$ |
| 0.01 | C | C | C | C | B | B | B | A | A | A | A |
| 0.05 | C | C | C | B | B | B | A | A | A | A | A |
| 0.1 | C | C | B | B | A | A | A | A | A | A | A |
| 0.2 | C | C | B | A | A | A | A | A | A | A | A |
| 0.3 | B | B | A | A | A | A | A | A | A | A | D |
| 0.5 | B | B | A | A | A | A | A | A | A | D | D |
| 0.7 | B | B | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |
| 10.0 | A | A | A | A | D | D | D | D | D | D | D |

TABLE 36

| | Used gas | Flow rate (SCCM) | Layer forming rate (Å/S) | Layer thickness (Å) | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5<br>B$_2$H$_6$/He = 3 × 10$^{-3}$ | SiH$_4$ = 200<br>B$_2$H$_6$ = 0.2 | 16 | 3000 | 0.2 | 250 | 0.5 | 13.56 |

TABLE 37

| Layer thickness of layer region (C) (μ) | Flow rate ratio of (SiH$_4$ + SiF$_4$) to C$_2$H$_4$ | | | | | | |
|---|---|---|---|---|---|---|---|
| | 9.99:0.01 | 9.95:0.05 | 9.9:0.1 | 9.5:0.5 | 8.5:1.5 | 3.5:6.5 | 1:9 |
| | Content of C atom in the layer (atomic %) | | | | | | |
| | 1 | 3 | 5 | 10 | 20 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |
| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

TABLE 38

| Layer thickness of layer region (n) (μ) | 0.5 | 1.0 | 1.5 | 2.0 | 5.0 | 10 | 20 | 50 | 70 | 80 |
|---|---|---|---|---|---|---|---|---|---|---|
| Evaluation | D | C | B | A | A | A | A | A | B | B |

TABLE 39

| | Used gas | Flow rate (SCCM) | Layer forming rate (Å/S) | Layer thickness | Discharge power (W/cm$^2$) | Support temperature (°C.) | Pressure upon reaction (torr) | Discharge frequency (MHz) |
|---|---|---|---|---|---|---|---|---|
| Layer region (I) | SiH$_4$/He = 0.5<br>PH$_3$/He = 3 × 10$^{-3}$ | SiH$_4$ = 200<br>Changing suitably | 16 | Changing suitably | 0.2 | 250 | 0.5 | 13.56 |

TABLE 40

| Layer thickness of layer region (I) ($\mu$) | Content of P (atomic ppm) | | | | | | | | | |
|---|---|---|---|---|---|---|---|---|---|---|
| | 0.1 | 0.5 | 1.0 | 50 | 100 | 200 | 500 | 800 | $10^3$ | $5 \times 10^3$ |
| 0.01 | D | D | C | C | C | C | B | B | A | A |
| 0.05 | D | C | C | C | B | B | A | A | A | A |
| 0.1 | C | C | C | B | A | A | A | A | A | A |
| 0.2 | C | C | B | A | A | A | A | A | A | B |
| 0.3 | B | B | B | A | A | A | A | A | A | B |
| 0.5 | B | B | B | A | A | A | A | A | B | C |
| 0.7 | B | B | A | A | A | A | A | A | B | C |
| 1.0 | A | A | A | A | A | A | A | B | C | D |
| 2.0 | A | A | A | A | A | A | B | C | D | D |
| 5.0 | A | A | A | A | A | A | B | D | D | D |
| 10.0 | A | A | A | A | B | B | D | D | D | D |

TABLE 41

| | Used gas | Flow rate (SCCM) | Layer forming rate (Å/S) | Layer thickness (Å) | Discharge power (W/cm²) | Support temperature (°C.) | Pressure upon reaction (torr) | Discharge frequency (MHz) |
|---|---|---|---|---|---|---|---|---|
| Layer region (I) | SiH₄/He = 0.5<br>PH₃/He = $3 \times 10^{-3}$ | SiH₄ = 200<br>PH₃ = 0.1 | 16 | 3000 | 0.2 | 250 | 0.5 | 13.56 |

TABLE 42

| Layer thickness of layer region (C) ($\mu$) | Flow rate ratio of (SiH₄ + SiF₄) to C₂H₄ | | | | | | |
|---|---|---|---|---|---|---|---|
| | 9.99:0.01 | 9.95:0.05 | 9.9:0.1 | 9.5:0.5 | 8.5:1.5 | 3.5:6.5 | 1:9 |
| | Content of C atom in the layer (atomic %) | | | | | | |
| | 1 | 3 | 5 | 10 | 20 | 50 | 70 |
| 0.005 | D | D | D | D | D | D | D |
| 0.01 | D | D | D | C | B | B | D |
| 0.02 | C | C | C | B | B | A | C |
| 0.04 | C | B | B | A | A | A | B |
| 0.1 | B | B | B | A | A | A | B |
| 0.2 | B | B | A | A | A | A | B |
| 0.5 | A | A | A | A | A | A | B |
| 0.7 | A | A | A | A | A | A | B |
| 1.0 | A | A | A | A | A | A | B |
| 2.0 | A | A | A | A | A | A | C |
| 5.0 | A | A | A | A | A | A | C |
| 10.0 | B | B | B | B | B | B | C |

TABLE 43

| Layer thickness of layer region (n) ($\mu$) | 0.5 | 1.0 | 1.5 | 2.0 | 5.0 | 10 | 20 | 50 | 70 | 80 |
|---|---|---|---|---|---|---|---|---|---|---|
| Evaluation | D | C | B | A | A | A | A | A | B | B |

TABLE 44

| | Used gas | Flow rate (SCCM) | Flow rate ratio | Discharge power (W/cm²) | Layer deposition rate (Å/sec) | Layer thickness ($\mu$) |
|---|---|---|---|---|---|---|
| Layer region (I) | SiH₄/He = 0.5<br>SiF₄/He = 0.5<br>B₂H₆/He = $3 \times 10^{-3}$ | (SiH₄ + SiF₄)/He = 150<br>B₂H₆ Changing suitably | SiH₄:SiF₄ = 8:2 | 0.18 | 9 | Changing suitably |

TABLE 45

| | Used gas | Flow rate (SCCM) | Flow rate ratio | Discharge power (W/cm²) | Layer deposition rate (Å/sec) | Layer thickness ($\mu$) |
|---|---|---|---|---|---|---|
| Layer region (n) | SiH₄/He = 0.5<br>SiF₄/He = 0.5 | (SiH₄ + SiF₄) = 150 | SiH₄:SiF₄ = 8:2 | 0.18 | 9 | 20 |

TABLE 46

| Layer thickness of layer region (I) (μ) | Content of B (atomic ppm) | | | | | | | | | | |
|---|---|---|---|---|---|---|---|---|---|---|---|
| | 1.0 | 5.0 | 10 | 50 | 100 | 500 | $1 \times 10^3$ | $2 \times 10^3$ | $5 \times 10^3$ | $1 \times 10^4$ | $3 \times 10^4$ |
| 0.01 | C | C | C | B | B | B | A | A | A | A | A |
| 0.05 | C | C | B | B | B | A | A | A | A | A | A |
| 0.1 | C | C | B | A | A | A | A | A | A | A | A |
| 0.2 | B | B | B | A | A | A | A | A | A | A | A |
| 0.3 | B | B | A | A | A | A | A | A | A | A | D |
| 0.5 | B | B | A | A | A | A | A | A | A | D | D |
| 0.7 | B | A | A | A | A | A | A | A | D | D | D |
| 1.0 | A | A | A | A | A | A | A | D | D | D | D |
| 2.0 | A | A | A | A | A | D | D | D | D | D | D |
| 5.0 | A | A | A | A | D | D | D | D | D | D | D |
| 10.0 | A | A | A | A | D | D | D | D | D | D | D |

EXAMPLE 11

By using the apparatus shown in FIG. 2, a layer formation on an Al cylinder support was effected by varying the layer thickness of layer region (I) and the content of phosphorus atom (P) in layer region (I). The common conditions for producing layer region (I) are shown in Table 24. Further, for each sample, layer region (n) was formed under the conditions in Table 18 and layer region (C) was formed under the conditions in Table 19.

The image forming members for electrophotography thus produced were evaluated in the same manners as in Example 1. The results are shown in Table 25.

EXAMPLE 12

Layer region (I) and layer region (n) were subsequently formed on an Al support under the conditions in Table 26 and Table 18, respectively, and then layer region (C) was formed by varying the content of carbon atoms in layer region (C) and the thickness thereof. The layer region (C) was formed under the conditions of Table 19 except that the content of carbon atoms was changed. The resulting image forming members for electrophotography were evaluated in the same manner as in Example 1. The results are shown in Table 27.

EXAMPLE 13

After forming layer region (I) on an Al support under the conditions of Table 21, layer region (n) was formed thereon by varying the layer thickness and then layer region (C) was formed under the conditions of Table 19. The layer region (n) was produced under the conditions of Table 18 except that the layer thickness was varied.

The resulting image forming members for electrophotography were evaluated in the same manner as in Example 1, and the results are shown in Table 28.

EXAMPLE 14

Layer formation was conducted by repeating the procedures of Example 1 except that layer region (I) and layer region (n) were produced under the conditions of Tables 29 and 30, respectively. The results are shown in Table 31.

EXAMPLE 15

By using the apparatus in FIG. 2, a layer was formed on an Al support by varying the layer thickness of and the boron atom (B) content in layer region (I). The common conditions for forming layer region (I) are shown in Table 32. Layer region (n) was formed on the resulting layer region (I) under the conditions of Table 33, and then, layer region (C) was formed thereon under the conditions of Table 34.

The resulting image forming member for electrophotography was set in a copying apparatus in the same way as in Example 1, and development was effected under the conditions of Table 5, and then the developed images were transferred to a plain paper and fixed. Such a series of steps was continuously repeated to produce many sheets of transferred copy. The resulting images were evaluated in the same way as in Example 1. The results are shown in Table 35.

EXAMPLE 16

Layer region (I) and layer region (n) were subsequently deposited on an Al support under the conditions of Table 36 and Table 33, respectively. Then, layer region (C) was formed thereon by varying the carbon atom content in and the layer thickness of the layer region (C). The layer region (C) was formed under the same conditions as in Table 34 except that the layer thickness and the carbon content were changed.

The resulting image forming members for electrophotography were evaluated in the same way as in Example 1. The results are shown in Table 37.

EXAMPLE 17

Layer region (I) was formed on an Al support under the conditions of Table 36. Then, layer region (n) was formed thereon by varying the layer thickness, and layer region (C) was formed under the conditions of Table 34.

Further, upon formation of layer region (n), the production conditions were as shown in Table 33 except that the layer thickness was changed.

The resulting image forming members for electrophotography were evaluated in the same way as in Example 1. The results are shown in Table 38.

EXAMPLE 18

By using the apparatus in FIG. 2, layer formation was effected on an Al cylinder support by varying the layer thickness of and the phosphorus atom (P) content in layer region (I). The common conditions for producing layer region (I) are shown in Table 39. Layer region (n) and then layer region (C) were formed thereon under the conditions of Table 33 and Table 34, respectively.

The resulting image forming members for electrophotography were evaluated in the same way as in Example 1. The results are shown in Table 40.

EXAMPLE 19

Layer region (I) and then layer region (n) were subsequently formed on an Al support under the conditions of Table 41 and Table 33, respectively. Then, layer region (C) was formed thereon by varying the carbon atom content in and the layer thickness of layer region (C). The conditions for forming the layer region (C) were the same as in Table 34 except that the layer thickness and the carbon atom content were changed.

The resulting image forming members for electrophotography were evaluated in the same way as in Example 1. The results are shown in Table 42.

EXAMPLE 20

Layer region (I) was formed on an Al substrate under the conditions of Table 41. Then, layer region (n) was formed thereon by varying the layer thickness, and layer region (C) was formed thereon under the conditions of Table 34. Upon forming the layer region (n), the conditions were the same as in Table 33.

The resulting image forming members for electrophotography were evaluated in Example 1. The results are shown in Table 43.

EXAMPLE 21

Layer formation was effected by repeating the procedures in Example 1 except that layer region (I) and layer region (n) were formed under the conditions of Table 44 and Table 45, respectively. Evaluation of the resulting image forming member was as shown in Table 46.

What we claim is:

1. A photoconductive member which comprises a support for a photoconductive member and an amorphous layer comprising a first layer region overlying the support and a second layer region overlying the first layer region, the first layer region having photoconductivity comprising an amorphous material which comprises silicon atoms as a matrix and at least one member selected from the group consisting of hydrogen atoms and halogen atoms as a constituent, the first layer region having a layer region (I) containing an impurity capable of controlling the electroconductivity type at the support side, and the second layer region comprising an amorphous material selected from the group consisting of an amorphous material (1) composed of silicon and carbon atoms of the formula: $Si_aC_{1-a}$ ($0<a<1$), an amorphous material (2) composed of silicon, carbon and hydrogen atoms of the formula: $(Si_bC_{1-b})_cH_{1-c}$ ($0<b, c<1$) and an amorphous material (3) composed of silicon, carbon and halogen (X) atoms, and if desired, additionally hydrogen atom of the formula: $(Si_dC_{1-d})_e(X, H)_{1-e}$ ($0<d, e<1$).

2. A photoconductive member according to claim 1 in which the impurity is an atom of Group III of the Periodic Table.

3. A photoconductive member according to claim 1 in which the impurity is an atom of Group V of the Periodic Table.

4. A photoconductive member according to claim 1 in which the concentration of the impurity contained in the layer region (I) ranges from 1.0 to $3 \times 10^4$ atomic ppm.

5. A photoconductive member according to claim 1 in which the concentration of the impurity contained in the layer region (I) ranges from 0.1 to $5 \times 10^3$ atomic ppm.

6. A photoconductive member according to claim 1 in which the layer thickness of the layer region (I) is 0.01–10 microns.

7. A photoconductive member according to claim 1 in which the layer thickness of the second layer region is 0.01–10 microns.

8. A photoconductive member according to claim 2 in which the atom of Group III of the Periodic Table is a member selected from the group consisting of B, Al, Ga, In and Tl.

9. A photoconductive member according to claim 3 in which the atom of Group V of the Periodic Table is a member selected from the group consisting of N, P, As, Sb and Bi.

10. A photoconductive member according to claim 1 in which the first layer region contains hydrogen atom.

11. A photoconductive member according to claim 10 in which the content of hydrogen atom in the first layer region is 1–40 atomic %.

12. A photoconductive member according to claim 1 in which the first layer region contains halogen atom.

13. A photoconductive member according to claim 12 in which the content of halogen atom in the first layer region is 1–40 atomic %.

14. A photoconductive member according to claim 1 in which the first layer region contains hydrogen atom and halogen atom.

15. A photoconductive member according to claim 14 in which the total content of hydrogen and halogen atoms in the first layer region is 1–40 atomic %.

16. A photoconductive member according to claim 1 in which the value of a is 0.1–0.99999.

17. A photoconductive member according to claim 1 in which the value of b is 0.1–0.99999 and the value of c is 0.6–0.99.

18. A photoconductive member according to claim 1 in which the value of d is 0.1–0.99999 and the value of e is 0.8–0.99.

* * * * *